(12) United States Patent
Carson et al.

(10) Patent No.: US 9,698,614 B2
(45) Date of Patent: Jul. 4, 2017

(54) ADJUSTING AN EXTENDED POWER LINE DISRUPTION TIME AND END-OF-LIFE USED FOR AT LEAST ONE BATTERY BACKUP UNIT IN A SYSTEM

(71) Applicant: INTERNATIONAL BUSINESS MACHINES CORPORATION, Armonk, NY (US)

(72) Inventors: Matthew D. Carson, Tucson, AZ (US); Jiwu Duan, Tucson, AZ (US); John C. Elliott, Tucson, AZ (US); Mark E. Hack, Austin, TX (US); Larry Juarez, Tucson, AZ (US); Ronald D. Martens, Benson, AZ (US); Brian A. Rinaldi, Tucson, AZ (US); Todd C. Sorenson, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/947,790

(22) Filed: Nov. 20, 2015

(65) Prior Publication Data
US 2017/0149242 A1   May 25, 2017

(51) Int. Cl.
*H02J 9/06* (2006.01)
*H02J 7/00* (2006.01)
*G01R 31/36* (2006.01)

(52) U.S. Cl.
CPC ............ *H02J 7/0047* (2013.01); *H02J 9/061* (2013.01); *G01R 31/3693* (2013.01)

(58) Field of Classification Search
None
See application file for complete search history.

(56) References Cited

U.S. PATENT DOCUMENTS

| 5,117,324 | A  | * | 5/1992 | Johnson, Jr. | ............... | G06F 1/30 307/66 |
| 7,493,441 | B2 |   | 2/2009 | Ashmore |   |   |

(Continued)

FOREIGN PATENT DOCUMENTS

WO   2012024182   2/2012

OTHER PUBLICATIONS

Bekiarov et al., "Uninterruptible Power Supplies: Classification, Operation, Dynamics, and Control", IEEE, 2002, pp. 8.

(Continued)

*Primary Examiner* — Sean Shechtman
(74) *Attorney, Agent, or Firm* — David W. Victor; Konrad Raynes Davd & Victor LLP.

(57) ABSTRACT

Provided are a computer program product, system, and method for adjusting an extended power line disruption time and end-of-life for at least one battery backup unit used in a system. A request is received to change from a first extended power line disruption time currently used in the system to a second extended power line disruption time. A first end-of-life and a second end-of-life correspond to the first extended power line disruption time and the second extended power line disruption time, respectively. A message is sent to a power distribution unit with information on the second extended power line disruption time to cause the power distribution unit to initiate a graceful shutdown of the system after power is supplied from the at least one battery backup unit for the second extended power line disruption time.

21 Claims, 4 Drawing Sheets

(56) References Cited

U.S. PATENT DOCUMENTS

| | | | |
|---|---|---|---|
| 8,907,807 B2 | 12/2014 | Huang et al. | |
| 2009/0167543 A1 | 7/2009 | Bi | |
| 2010/0138177 A1* | 6/2010 | Yu | G01R 31/3651 702/63 |
| 2013/0158915 A1 | 6/2013 | Humla | |
| 2013/0198537 A1 | 8/2013 | Uehara | |
| 2014/0331070 A1* | 11/2014 | Du | H02J 9/00 713/340 |
| 2014/0368033 A1* | 12/2014 | Manikandan | H02J 7/0047 307/23 |

OTHER PUBLICATIONS

A. Westphal, et al., "IBM System Storage DS8000 Architecture and Implementation", IBM Corporation, IBM Document No. SG24-8886-02, Nov. 2012, pp. 534.

"Extended power line disturbance", IBM Corporation, [online][retrieved Nov. 8, 2015] http://www-01.ibm.com/support/knowledgecenter/api/content/nl/en-us/ . . . , pp. 1.

"DS8800 (Models 951 and 95E)", IBM Corporation, [online][retrieved Nov. 8, 2015] https://www-01.ibm.com/support/knowledgecenter/api/content/nl/en-us . . . pp. 5.

"DS8700 overview", IBM Corporation, [online][retrieved Nov. 8, 2015] https://www-01.ibm.com/support/knowledgecenter/api/content/nl/en-us . . . , pp. 2.

"Introduction and Planning Guide: IBM System Storage D58800 and DS8700", Version 6 Release 3, IBM Corporation, IBM Document No. GC27-2297-09, 2012, pp. 256.

* cited by examiner

Extended Power Line Disruption (ePLD)
Information Instance

ADJUSTING AN EXTENDED POWER LINE DISRUPTION TIME AND END-OF-LIFE USED FOR AT LEAST ONE BATTERY BACKUP UNIT IN A SYSTEM

BACKGROUND OF THE INVENTION

1. Field of the Invention

The present invention relates to a computer program product, system, and method for adjusting an extended power line disruption time and end-of-life for at least one battery backup units used in a system.

2. Description of the Related Art

Enterprise storage systems are typically provided with redundant battery backup units to supply power to the system in the event of disruption to the power supply. The storage system may include power disruption units that power the components in the system from power supplied by an external power source or the battery backup units. The system may provide an extended power line disruption (ePLD) feature which supplies power to the system to perform normal operations from the battery backup units after a power loss for an ePLD time. After the ePLD time, the power distribution units may then initiate a graceful shutdown using battery power to cause the one or more processing complexes in the system to destage any data updates in volatile memory to non-volatile memory, and shutdown operations in a manner that avoids data loss and data corruption, and unstable system states. The total battery life available after power disruption may comprise the ePLD time plus the time to perform a graceful system shutdown.

A user may purchase additional battery backup units to increase the ePLD time available in the system. By increasing the ePLD time, the system may prolong system availability during moments of unexpected power loss. The longer the batteries can supply power during the ePLD time to maintain system power, the greater the possibility the system remains fully functional during small gaps of power loss.

There is a need in the art for improved techniques for managing the ePLD times used in the system.

SUMMARY

Provided are a computer program product, system, and method for adjusting an extended power line disruption time and end-of-life for at least one battery backup unit used in a system. A request is received to change from a first extended power line disruption time currently used in the system to a second extended power line disruption time. The first and second extended power line disruption times comprise a time during which the system continues with read and write operations using power from the at least one battery backup unit before initiating a graceful shutdown procedure of the system. A first end-of-life and a second end-of-life correspond to the first extended power line disruption time and the second extended power line disruption time, respectively. A message is sent to a power distribution unit with information on the second extended power line disruption time to cause the power distribution unit to initiate a graceful shutdown of the system after power is supplied from the at least one battery backup unit for the second extended power line disruption time.

DETAILED DESCRIPTION

In past battery power solutions, users were required to purchase a set amount of battery extension time at the point of system purchase. If users wanted to increase the extended power line disruption (ePLD) time the system is fully operational and available after a power loss, they would have to add additional battery backup units to the system. Adding additional battery backup units is time consuming and may not be available if there is not sufficient available physical space in the system. Described embodiments address these constraints by allowing changes to the ePLD time in the system by adjusting system settings without having to add battery backup units. This allows the user to readily adjust or the system to dynamically and automatically adjust the ePLD time used in the system.

With described embodiments, a request is received, by a user or system program, to change from a first extended power line disruption time currently used in the system to a second extended power line disruption time. A first end-of-life and a second end-of-life correspond to the first extended power line disruption time and the second extended power line disruption time, respectively. A message is sent to a power distribution unit with information on the second extended power line disruption time to cause the power distribution unit to initiate a graceful shutdown of the system after power is supplied from the at least one battery backup unit for the second extended power line disruption time.

The described embodiments allow the user or system to vary the ePLD time used in the system. When increasing the ePLD time, the battery end-of-life (EOL) time needs to be adjusted because as time progresses over the battery lifetime, battery backup units degrade and have less power to output. Increasing the ePLD and time the system remains fully operational from battery power before a graceful shutdown requires a reduction in the end-of-life to ensure that during the battery life prior to the end-of-life, the batteries have sufficient capabilities to provide the increased ePLD time.

Figure 1:
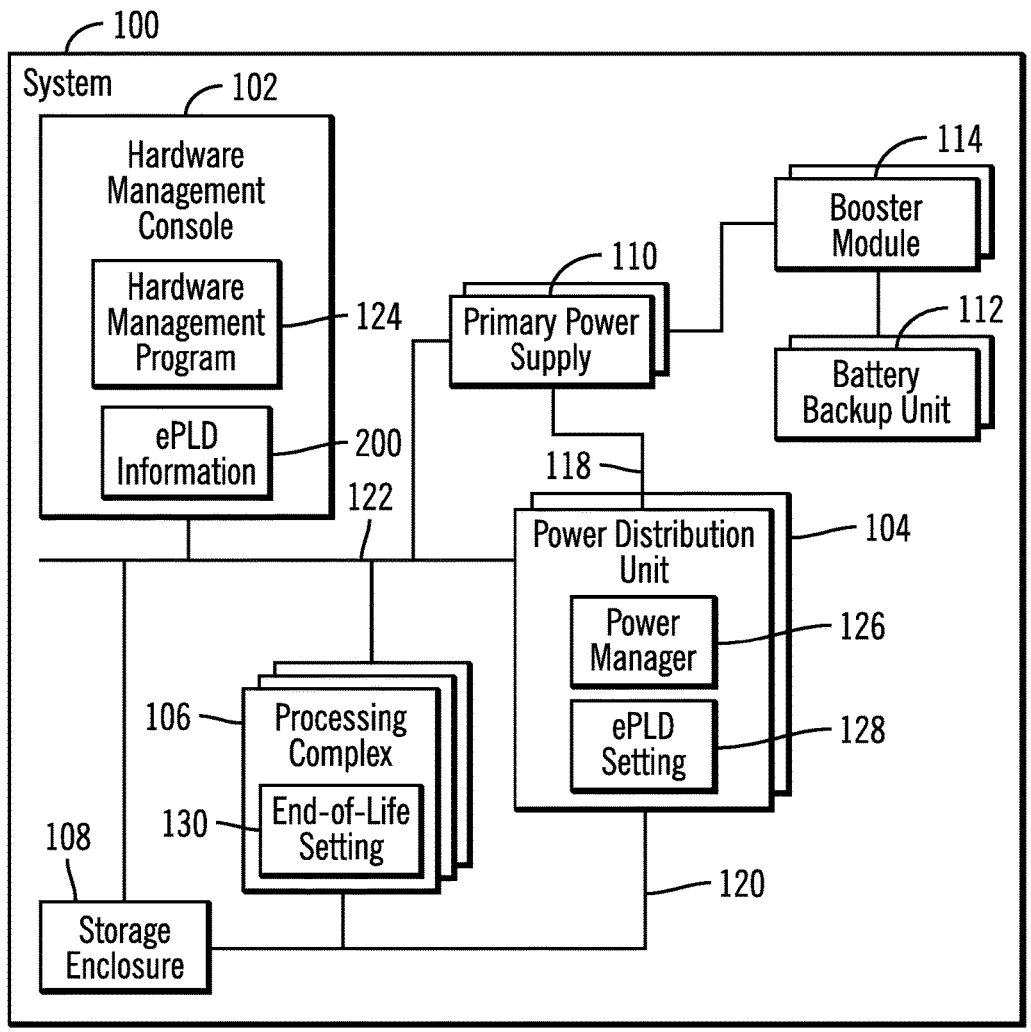
FIG. 1 illustrates an embodiment of a computing system.

FIG. 1 illustrates an embodiment of a system 100 having a hardware management console 102 that manages components in the system 100, including one or more power distribution units 104 that supply power to one or more processing complexes 106 and a storage enclosure 108 having storage devices. The processing complexes 106 may perform read and write operations with respect to the storage devices in the storage enclosure 108. The power distribution units 104 may receive power from one or more primary power supplies 110. If AC or external power is interrupted to the power supplies 110, then power may be supplied to the power supplies 110 from one or more battery backup units 112 via booster modules 114 that supply power from the battery backup units 112 to the power supplies 110, where there may be one booster module 114 for each of the power supplies 110. The battery backup units 112 supply power to the system 100 in the event of a loss of external power to the power supplies 110.

The primary power supplies 110 supply power to the power distribution units 104 over a power supply bus 118, and the power distribution units 104 supply power to the processing complex 106 and storage enclosure 108 over a power supply bus 120.

The hardware management console 102 may communicate data and commands to the primary power supply 110, power distribution unit 104, processing complex 106, and storage enclosure 108 over a data and command bus 122, such as a Peripheral Component Interconnect (PCI) type bus.

The power distribution units 104 maintain an ePLD setting 128 indicating the ePLD time used in the system and the processing complexes 106 indicate an end-of-life setting 130 indicating a lifetime duration that should be used for the battery backup units 112 to determine when to order new units.

In one embodiment, the hardware management console 102 may comprise a separate computer, such as a laptop, tablet, etc., with a display and keyboard, coupled to the system 100, and the processing complexes 106 may comprise hardware for independent redundant computer systems with their own operating systems, such as Central Electronic Complexes (CECs). The storage enclosure 108 may include numerous storage devices, such as one or more storage devices known in the art, such as a solid state storage device (SSD) comprised of solid state electronics, EEPROM (Electrically Erasable Programmable Read-Only Memory), flash memory, flash disk, Random Access Memory (RAM) drive, storage-class memory (SCM), Phase Change Memory (PCM), resistive random access memory (RRAM), spin transfer torque memory (STM-RAM), conductive bridging RAM (CBRAM), magnetic hard disk drive, optical disk, tape, etc. The storage devices may further be configured into an array of devices, such as Just a Bunch of Disks (JBOD), Direct Access Storage Device (DASD), Redundant Array of Independent Disks (RAID) array, virtualization device, etc. Further, the storage devices may comprise heterogeneous storage devices from different vendors or from the same vendor.

The power distribution units 104 may comprise rack power controllers. The power supplies 110, battery backup units 112, and power distribution units 104 may comprise redundant power supplies. The battery backup units 112 protect data in the event of a loss of external power to the power supplies 110. The system 100 may further include device and network adaptors.

In one embodiment, the power distribution units 104 implement extended power line disruption (ePLD) which is a feature by which the power distribution units 104 supply power from the battery backup units 112 for a specified duration based on the capabilities and number of battery backup units 112 to allow for normal processing and read and write operations to the storage enclosure 108 from the processing complexes 106. After the ePLD time duration, the power distribution units 104 will initiate a graceful shutdown procedure to cause the processing complexes 106 to destage all data and shutdown in preparation for a system 100 wide shutdown which will not result in loss of data or data corruption. With the ePLD feature, if there is a brief power disruption, for less than the ePLD duration, and external power resumes within the ePLD duration, then the system 100 can continue operations without having to undergo a shutdown.

The hardware management console 102 includes a hardware management program 124 to allow the user to configure the system 100 components, including controlling an ePLD time 128 implemented by the power distribution units 104. The hardware management program 102 maintains ePLD information 200 which has different ePLD times that are available for selection based on the specifications of the battery backup units 112, which may be supplied by the battery backup unit 112 manufacturer, and the number of battery backup units 112. For instance, the battery backup units 112 may provide different selectable options for ePLD times and end-of-lives for each available ePLD time. The ePLD information 200 includes instances of available ePLD times that may be selected for use by the power distribution units 104 to implement in the event of power disruption.

Figure 2:
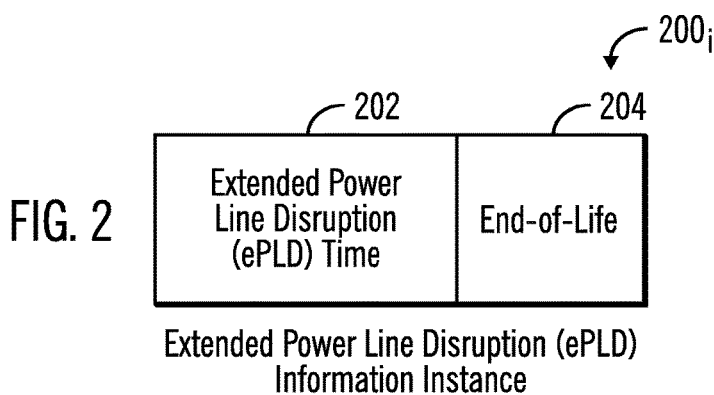
FIG. 2 illustrates an embodiment of an extended power line disruption information instance.

FIG. 2 provides an embodiment of an instance of ePLD information $200_i$ including an ePLD time 202 and an end-of-life 204 to apply when the ePLD time 202 is used. The end-of-life 204 may be used by the processing complexes 106 or other component to perform battery end-of-life handling operations upon occurrence of one of the at least one battery backup unit 112 reaching the second end-of-life. The end-of-life handling operation may involve generating an alert to order new battery backup units 112. The battery end-of-life may be determined by determining whether a duration of time from the born-on-date of each battery backup unit 112 to a current time exceeds the end-of-life. The born-on date may comprise the time the battery backup unit 112 was produced, which may be indicated on a manufacturer label on the battery unit 112, and maintained in firmware of the battery unit 112. Generally, an instance $200_i$ having a lower ePLD time 202 than another instance $200_j$ will have a higher end-of-life 204 than the instance $200_j$ having a higher ePLD time 202 because the battery providing a shorter duration ePLD time 202 will have a longer life during which that lower ePLD can be provided. A higher ePLD requires a shorter end-of-life because the longer ePLD times degrades the battery backup unit faster and reduces its capacity to provide the higher ePLD time over a same time period.

The hardware management program 124 provides a user interface, e.g., a graphical user interface (GUI) or command line interface, to allow the user to select one of multiple ePLD instances $200_i$ to implement in the system 100. The hardware management program 124 may further provide application programming interfaces (APIs) for system components to use to request a change to the ePLD 128 and end-of-life 130 settings by selecting from one of multiple ePLD instances 200i to implement in the system 100. System components, such as the power distribution unit 104, may dynamically and automatically adjust the ePLD 128 settings.

The power distribution units 104 include a power manager 126 comprising a program to manage the power distribution unit 104 operations and implement the ePLD setting 128 providing an ePLD time 202 during which the power distribution units 104 provide power for normal system operations, including the processing complex 106, storage enclosure 108, etc., before initiating a graceful shutdown procedure.

The processing complexes 106 may maintain an the end-of-life setting 130 providing a current end-of-life used in the system 100 for the battery backup units 112 that corresponds to the ePLD setting 128 that is being used, where the end-of-life setting 130 would comprise the end-of-life 204 indicated in an ePLD information instance $200_i$ having the ePLD time 202 used for the ePLD setting 128.

The values of the ePLD setting 128 and end-of-life setting 130 may change if the user through the hardware management program 124 selects a different ePLD time 202 to use for a ePLD information instance $200_j$ different from the ePLD instance $200_i$ whose ePLD time 202 and end-of-life 204 are currently used for the ePLD 128 and end-of-life 130 settings, respectively.

The different components 102, 104, and 106 may each maintain information on the current ePLD 128 and end-of-life 130 settings being used in the system 100.

Figure 3:
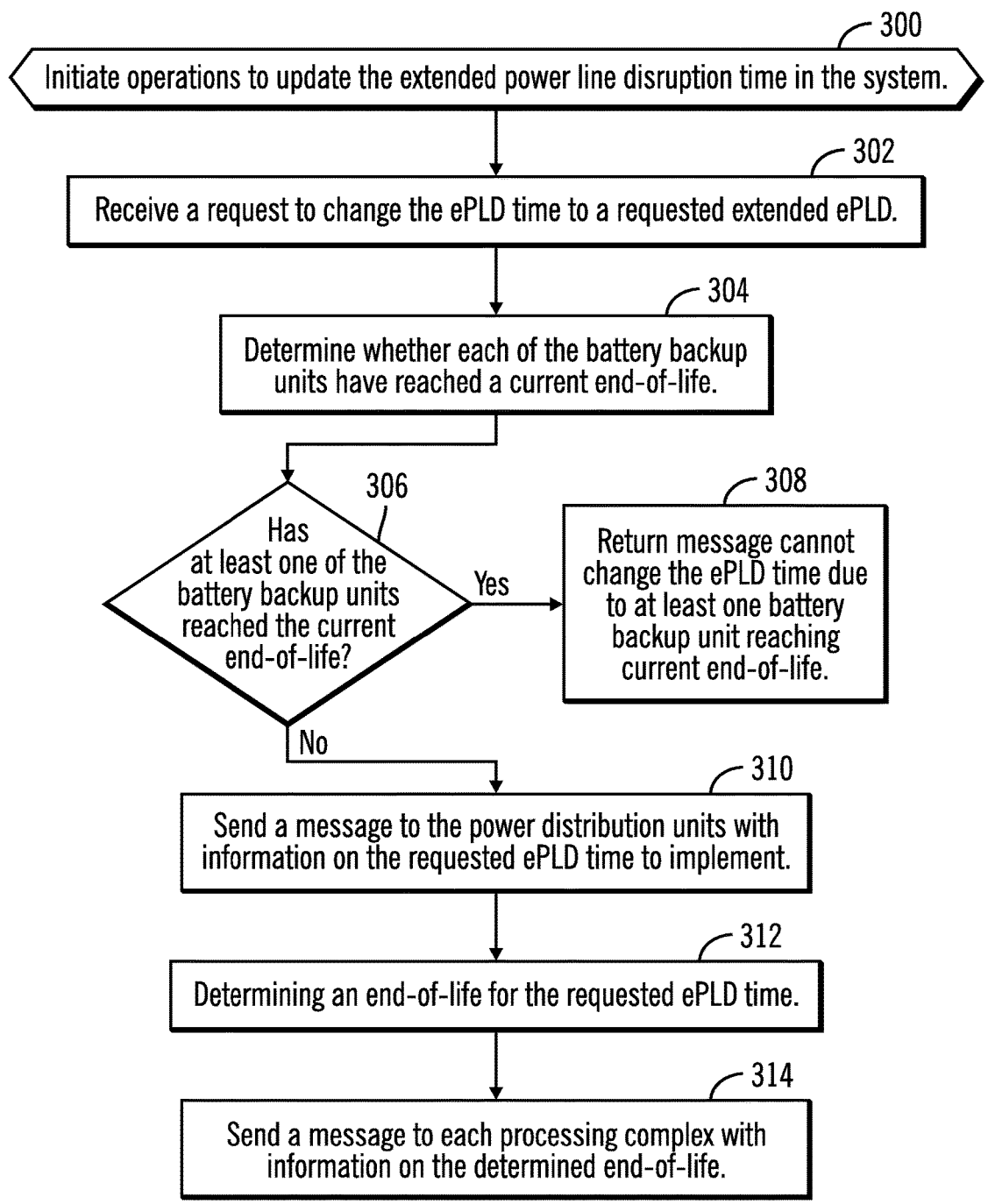
FIG. 3 illustrates n embodiment of operations to update the extended power line disruption time used in the system.

FIG. 3 illustrates an embodiment of operations performed by the hardware management program 124 to update the ePLD time used in the system 100. Upon initiating (at block 300) operations to update the ePLD time, a request is received (at block 302) from a user or program to change the ePLD time setting 128 to a requested ePLD time. The hardware management program 124 may present multiple ePLD times available from the ePLD information 200 that are available for use with the battery backup units 112. A user or program may request one of the ePLD times indicated in the ePLD information instances $200_i$ to use in the system 100.

The hardware management program 124 determines (at block 304) whether each of the battery backup units 112 have reached the current end-of-life used in the system, as indicated in the current end-of-life setting 130. A battery backup unit 112 is determined to reach its end-of-life if the difference of time from the born-on-date of the battery backup unit 112 and the current time exceeds the end-of-life being used in the system 100, as indicated in setting 130. If (at block 306) at least one of the battery backup units 112 has reached the current end-of-life, then the hardware management program 124 returns (at block 308) a message that the ePLD time cannot be changed due to at least one of the battery backup units 112 having reached the end-of-life that is being used in the system 100.

If (at block 306) all the battery backup units 112 have not reached the current end-of-life 130, then the hardware management program 124 sends (at block 310) a message to the power distribution units 104 with information on the requested ePLD time for the power distribution units 104 to implement upon detecting power loss from an external power source. In one embodiment, the information provided in the message may comprise the requested ePLD time, which may be lower or higher than the current ePLD time 128 used in the system 100. In an alternative embodiment, the information provided in the message may indicate a change in the ePLD time, increase or decrease in time, to use to adjust the current ePLD time 128.

The hardware management program 124 further determines (at block 312) an end-of-life 204 provided for the requested ePLD time 202 in one of the ePLD information instances $200_j$ having the requested ePLD time. A message is sent (at block 314) to each processing complex 106 indicating the determined end-of-life to use to update the end-of-life setting 130 in the processing complexes 106. The processing complexes 106 use the end-of-life setting 130 to determine when to send an alert indicating that the battery backup units 112 have reached the end-of-life indicated in the setting 130. Different battery backup units 112 may have different born-on-date times and thus may reach their end-of-life 130 at different times.

Figure 4:
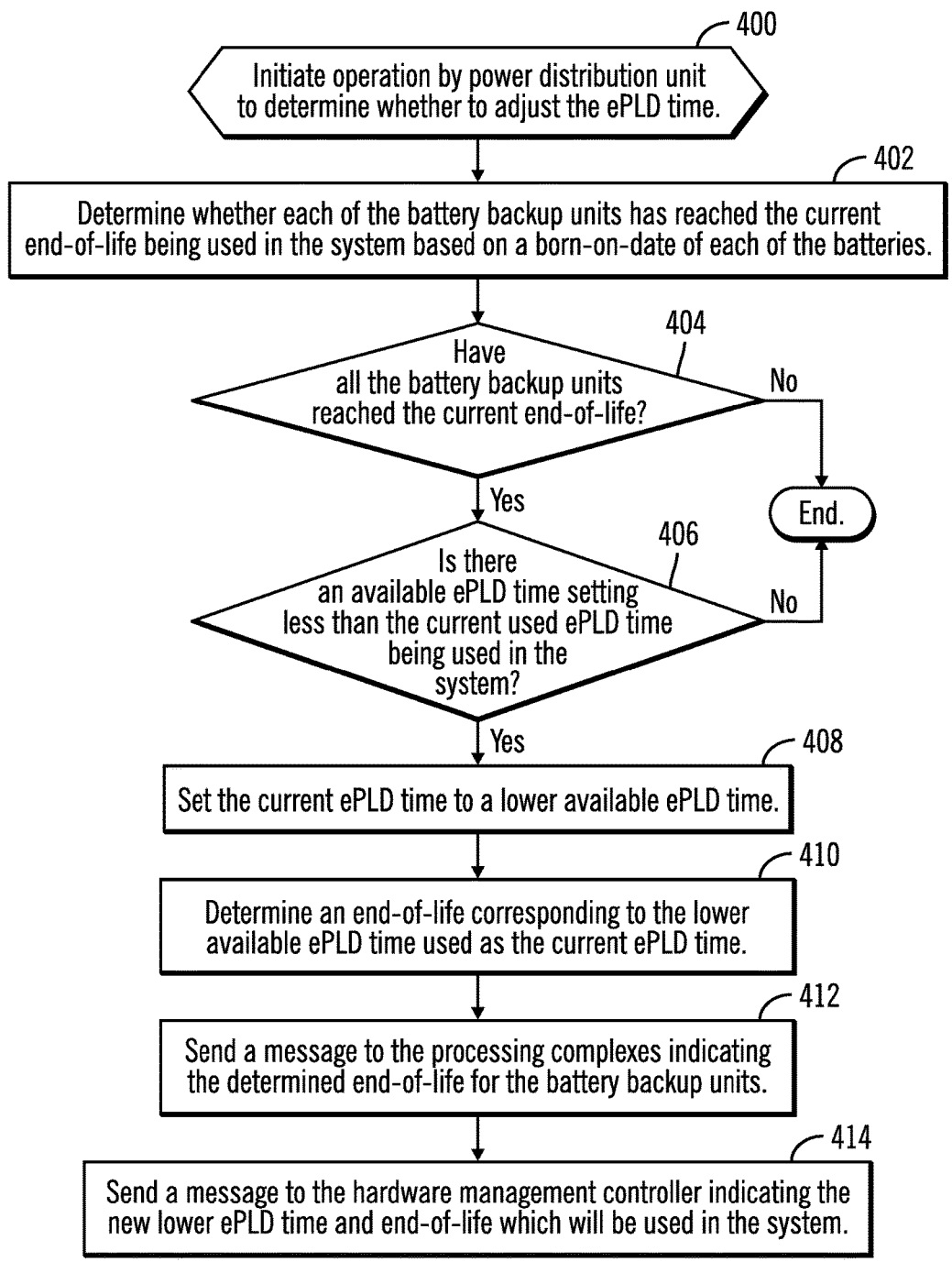
FIG. 4 illustrates an embodiment of operations to determine whether to adjust the ePLD time used in the system.

FIG. 4 illustrates an embodiment of operations performed by the power distribution units 104 to determine whether to adjust the ePLD time used in the system 100 as indicated in the ePLD setting 128. Upon initiating (at block 400) operations to determine whether to adjust the ePLD setting 128, the power manager 126 in the power distribution unit 104 determines (at block 402) whether each of the battery backup units 112 has reached the current end-of-life 130 being used in the system 100 based on a born-on-date of each of the batteries. If (at block 404) all of the battery backup units 112 have reached the current end-of-life and if (at block 406) there is an available ePLD time setting, as indicated in one of the ePLD information instances $200_i$, that is less than the current used ePLD time 128, then the current ePLD setting 128 is set (at block 408) to a lower available ePLD time 202 indicated in one of the ePLD information instances $200_i$. If there are multiple ePLD instances $200_j$ having ePLD times lower than the current used ePLD time 128, then the power manager 126 may select a highest of the lower available ePLD times to use or select a lowest of the lower available ePLD times to use for the current ePLD setting 128.

The power manager 126 determines (at block 410) an end-of-life 204 corresponding to the lower available ePLD time set as the current ePLD time 128. The corresponding end-of-life 204 may be determined from the ePLD information instance $200_j$ having the lower available ePLD time set as the current ePLD time 128. The power manager 126 may send (at block 412) a message to the processing complexes 106 indicating the determined end-of-life for the battery backup units 112. The end-of-life setting 130 may then be updated with the determined end-of-life for the new lower ePLD time being used in the system. In one embodiment, the information on the end-of-life provided in the message may comprise the determined end-of-life, which may be lower or higher than the current end-of-life 130 used in the system 100. In an alternative embodiment, the end-of-life information provided in the message may indicate a change in the end-of-life time, increase or decrease in time, to use to adjust the current end-of-life time 130.

If (at block 404) all the battery backup units 112 have reached the current end-of-life, as indicated in the setting 130, or if (at block 404) there is no available ePLD time indicating in one of the ePLD information instances $200_j$ having a lower ePLD time than the current ePLD time 128 used in the system, then control ends without changing the ePLD 128 and end-of-life 130 settings used in the system 100.

The operations at blocks 406-412 were based on considering whether there were available lower ePLD times that may be selected for use in the system 100. In alternative embodiments, the operations at blocks 406 may determine whether there is an available higher end-of-life time in one of the ePLD information instances $200_j$ that may be selected for use in the system, where a higher end-of-life value for the battery backup units 112 corresponds to a lower ePLD time. Further, the message with the new determined end-of-life information may be sent to other components that may manage the handling of end-of-life notifications and operations.

Described embodiments provide techniques to allow a user or system to adjust the ePLD time used in the system, which then sends a message to update ePLD and end-of-life settings in the system to accommodate the new selected ePLD time without having to physically add battery backup units.

The letter designators, such as i and j used to designate an element and/or a number of instances of an element may indicate a variable number of instances of that element when used with the same or different elements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
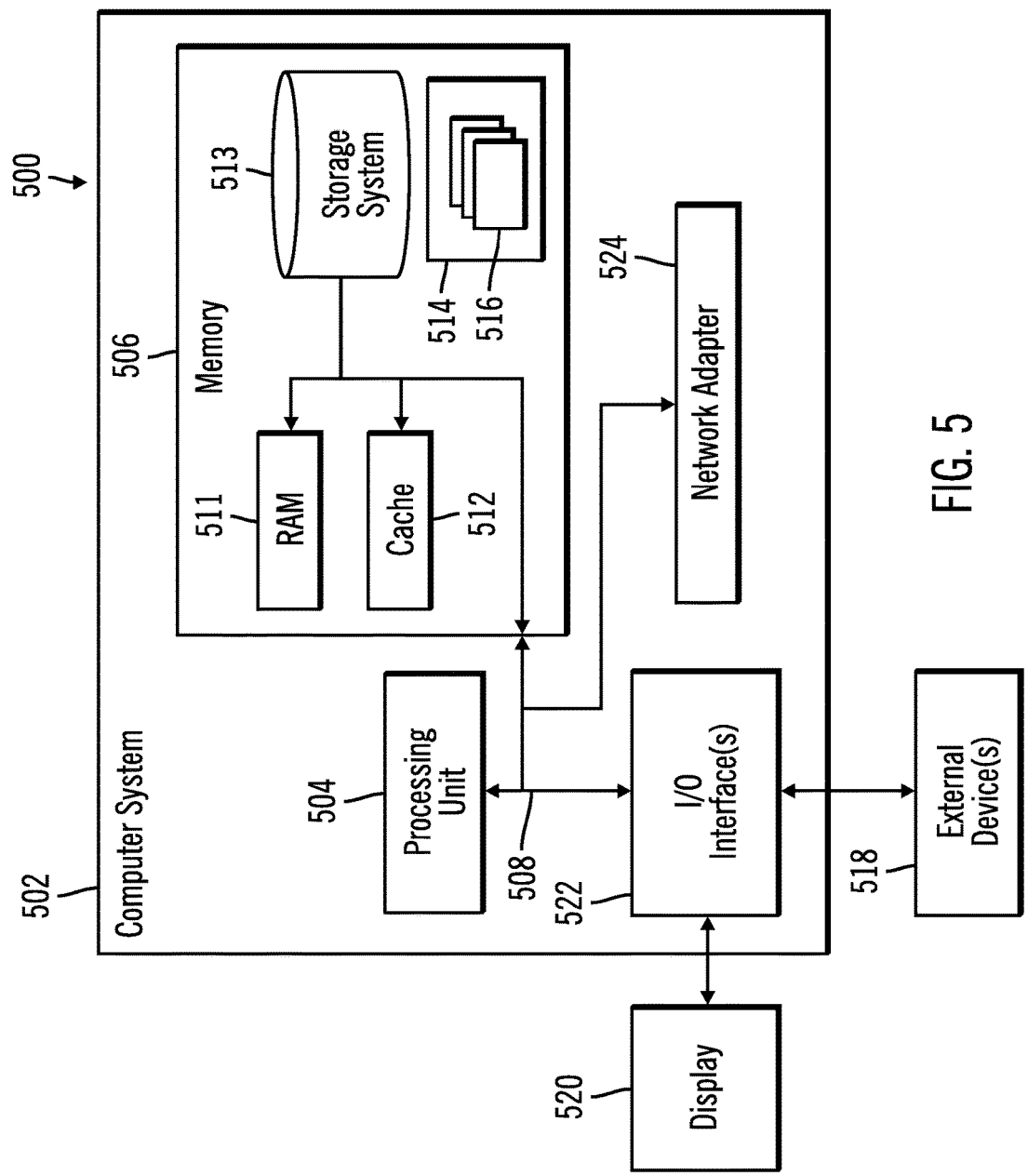
FIG. 5 illustrates a computing environment in which the components of FIG. 1 may be implemented.

The computational components of FIG. 1, including the hardware management console 102, power distribution units 104, and processing complexes 106 may be implemented in one or more computer systems, such as the computer system 502 shown in FIG. 5. Computer system/server 502 may be described in the general context of computer system executable instructions, such as program modules, being executed by a computer system. Generally, program modules may include routines, programs, objects, components, logic, data structures, and so on that perform particular tasks or implement particular abstract data types. Computer system/server 502 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, the computer system/server 502 is shown in the form of a general-purpose computing device. The components of computer system/server 502 may include, but are not limited to, one or more processors or processing units 504, a system memory 506, and a bus 508 that couples various system components including system memory 506 to processor 504. Bus 508 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 502 typically includes a variety of computer system readable media. Such media may be any available media that is accessible by computer system/server 502, and it includes both volatile and non-volatile media, removable and non-removable media.

System memory 506 can include computer system readable media in the form of volatile memory, such as random access memory (RAM) 510 and/or cache memory 512. Computer system/server 502 may further include other removable/non-removable, volatile/non-volatile computer system storage media. By way of example only, storage system 513 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 908 by one or more data media interfaces. As will be further depicted and described below, memory 506 may include at least one program product having a set (e.g., at least one) of program modules that are configured to carry out the functions of embodiments of the invention.

Program/utility 514, having a set (at least one) of program modules 516, may be stored in memory 506 by way of example, and not limitation, as well as an operating system, one or more application programs, other program modules, and program data. Each of the operating system, one or more application programs, other program modules, and program data or some combination thereof, may include an implementation of a networking environment. The components of the computer 502 may be implemented as program modules 516 which generally carry out the functions and/or methodologies of embodiments of the invention as described herein. The systems of FIG. 1 may be implemented in one or more computer systems 502, where if they are implemented in multiple computer systems 502, then the computer systems may communicate over a network.

Computer system/server 502 may also communicate with one or more external devices 518 such as a keyboard, a pointing device, a display 520, etc.; one or more devices that enable a user to interact with computer system/server 502; and/or any devices (e.g., network card, modem, etc.) that enable computer system/server 502 to communicate with one or more other computing devices. Such communication can occur via Input/Output (I/O) interfaces 522. Still yet, computer system/server 502 can communicate with one or more networks such as a local area network (LAN), a general wide area network (WAN), and/or a public network (e.g., the Internet) via network adapter 524. As depicted, network adapter 524 communicates with the other components of computer system/server 502 via bus 508. It should be understood that although not shown, other hardware and/or software components could be used in conjunction with computer system/server 502. Examples, include, but are not limited to: microcode, device drivers, redundant processing units, external disk drive arrays, RAID systems, tape drives, and data archival storage systems, etc.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A computer program product for managing an extended power line disruption time for a system having at least one battery backup unit, the computer program product comprising a computer readable storage medium having computer readable program code embodied therein that when executed causes operations to be performed, the operations comprising:

maintaining extended power line disruption time information including a first extended power line disruption time currently used in the system and a second extended power line disruption time, wherein the first and second extended power line disruption times comprise a time during which the system continues with read and write operations using power from the at least one battery backup unit before initiating a graceful shutdown procedure of the system, wherein the first and second extended power line disruption times indicated in the extended power line disruption time information are different times and are available for selection to use with the at least one battery backup unit, and wherein a first end-of-life and a second end-of-life correspond to the first extended power line disruption time and the second extended power line disruption time, respectively;

receiving a request to change from the first extended power line disruption time to the second extended powerline disruption time; and sending a message to a power distribution unit with information on the second extended power line disruption time to cause the power distribution unit to initiate a graceful shutdown of the system after power is supplied from the at least one battery backup unit for the second extended power line disruption time.

2. The computer program product of claim 1, wherein the second extended power line disruption time is either greater or less than the first extended power line disruption time, wherein the first end-of-life is greater than the second end-of-life when the first extended power line disruption time is less than the second extended power line disruption time, and wherein the first end-of-life is less than the second end-of-life when the first extended power line disruption time is greater than the second extended power line disruption time.

3. The computer program product of claim 1, wherein the operations further comprise:

sending a message to at least one processing complex having information on the second end-of-life to cause the at least one processing complex to perform battery end-of-life handling operations upon occurrence of one of the at least one battery backup unit reaching the second end-of-life.

4. The computer program product of claim 1, wherein the power distribution unit comprises at least one rack power controller that manages the graceful shutdown of the system.

5. The computer program product of claim 1, wherein the operations further comprise:

determining whether each of the at least one battery backup unit is at the first end-of-life, wherein the sending of the message is performed in response to determining that the at least one battery backup unit is not at the first end-of-life.

6. The computer program product of claim 1, wherein the at least one battery backup unit comprises at least two battery backup units, wherein the first extended power line disruption time is used in response to the at least two battery backup units having reached the second end-of-life when the second end-of-life and the second extended power line disruption time are currently being used in the system, wherein the operations further comprise:

sending to a hardware management controller information on the second extended power line disruption time being used in the system.

7. The computer program product of claim 1, wherein there is at least one additional extended power line disruption time and corresponding at least one additional end-of-life, wherein the request indicates to change to any of the first, second and at least one additional extended power line disruption times different from a current extended power line disruption time being used by the power distribution unit to determine when to initiate the graceful shutdown after power disruption.

8. The computer program product of claim 1, wherein the information on the second extended power line disruption time sent in the message indicates an amount of time to increase or decrease the extended power line disruption time used by the power distribution unit.

9. A computer program product for managing an extended power line disruption time for a system having at least one battery backup unit, the computer program product comprising a computer readable storage medium having computer readable program code embodied therein that when executed causes operations to be performed, the operations comprising:

receiving a request to change from a first extended power line disruption time currently used in the system to a second extended power line disruption time, wherein the first and second extended power line disruption times comprise a time during which the system continues with read and write operations using power from the at least one battery backup unit before initiating a graceful shutdown procedure of the system, wherein a first end-of-life and a second end-of-life correspond to the first extended power line disruption time and the second extended power line disruption time, respectively, and wherein the first end-of-life is greater than the second end-of-life and the first extended power line disruption time is less than the second extended power line disruption time;

sending a message to a power distribution unit with information on the second extended power line disruption time to cause the power distribution unit to initiate a graceful shutdown of the system after power is supplied from the at least one battery backup unit for the second extended power line disruption time; and in response to the at least one battery backup unit having reached the second end-of-life when the second end-of-life and the second extended power line disruption time are being used in the system, indicating, by the power distribution unit, to use the first extended power line disruption time to determine when to initiate the graceful shutdown of the system in response to the power to the system switching to the at least one battery backup unit.

10. A system, comprising:

at least one battery backup unit;

at least one processing complex;

at least one power distribution unit to distribute power to the at least one processing complex from an external power source or from the at least one battery backup unit; and a hardware management controller that when executed performs operations, the operations comprising:
  maintaining extended power line disruption time information including a first extended power line disruption time currently used in the system to a second extended power line disruption time, wherein the first and second extended power line disruption times comprise a time during which the system continues with read and write operations using power from the at least one battery backup unit before initiating a graceful shutdown procedure of the system, wherein the first and second extended power line disruption times indicated in the extended power line disruption time information are different times and are available for selection to use with the at least one battery backup unit, and wherein a first end-of-life and a second end-of-life correspond to the first extended power line disruption time and the second extended power line disruption time, respectively;
  receiving a request to change from the first extended power line disruption time to the second extended powerline disruption time; and
  sending a message to the power distribution unit with information on the second extended power line disruption time to cause the power distribution unit to initiate a graceful shutdown of the system after power is supplied from the at least one battery backup unit for the second extended power line disruption time.

11. The system of claim 10, wherein the operations further comprise:
  sending a message to the at least one processing complex having information on the second end-of-life to cause the at least one processing complex to perform battery end-of-life handling operations upon occurrence of one of the at least one battery backup unit reaching the second end-of-life.

12. The system of claim 10, wherein the operations further comprise:
  determining whether each of the at least one battery backup unit is at the first end-of-life, wherein the sending of the message is performed in response to determining that the at least one battery backup unit is not at the first end-of-life.

13. The system of claim 10, wherein the at least one battery backup unit comprises at least two battery backup units, wherein the first extended power line disruption time is used in response to the at least two battery backup units having reached the second end-of-life when the second end-of-life and the second extended power line disruption time are currently being used in the system, wherein one of the at least one power distribution unit sends the hardware management controller information on the second extended power line disruption time being used in the system.

14. The system of claim 10, wherein there is at least one additional extended power line disruption time and corresponding at least one additional end-of-life, wherein the request indicates to change to any of the first, second and at least one additional extended power line disruption times different from a current extended power line disruption time being used by the power distribution unit to determine when to initiate the graceful shutdown after power disruption.

15. A system, comprising:
  at least one battery backup unit;
  at least one processing complex;
  at least one power distribution unit to distribute power to the at least one processing complex from an external power source or from the at least one battery backup unit; and
  a hardware management controller that when executed performs operations, the operations comprising:
    receiving a request to change from a first extended power line disruption time currently used in the system to a second extended power line disruption time, wherein the first and second extended power line disruption times comprise a time during which the system continues with read and write operations using power from the at least one battery backup unit before initiating a graceful shutdown procedure of the system, and wherein a first end-of-life and a second end-of-life correspond to the first extended power line disruption time and the second extended power line disruption time, respectively, and wherein the first end-of-life is greater than the second end-of-life and the first extended power line disruption time is less than the second extended power line disruption time;
    sending a message to the power distribution unit with information on the second extended power line disruption time to cause the power distribution unit to initiate a graceful shutdown of the system after power is supplied from the at least one battery backup unit for the second extended power line disruption time; and
  wherein in response to the at least one battery backup unit having reached the second end-of-life when the second end-of-life and the second extended power line disruption time are being used in the system, the one of the at least one power distribution unit indicates to use the first extended power line disruption time to determine when to initiate the graceful shutdown of the system in response to the power to the system switching to the at least one battery backup unit.

16. A method for managing an extended power line disruption time for a system having at least one battery backup unit, comprising:
  maintaining extended power line disruption time information including from a first extended power line disruption time currently used in the system to a second extended power line disruption time, wherein the first and second extended power line disruption times comprise a time during which the system continues with read and write operations using power from the at least one battery backup unit before initiating a graceful shutdown procedure of the system, wherein the first and second extended power line disruption times indicated in the extended power line disruption time information are different times and are available for selection to use with the at least one battery backup unit, and wherein a first end-of-life and a second end-of-life correspond to the first extended power line disruption time and the second extended power line disruption time, respectively;
  receiving a request to change from the first extended power line disruption time to the second extended powerline disruption time; and
  sending a message to a power distribution unit with information on the second extended power line disruption time to cause the power distribution unit to initiate a graceful shutdown of the system after power is supplied from the at least one battery backup unit for the second extended power line disruption time.

17. The method of claim 16, further comprising:
sending a message to at least one processing complex having information on the second end-of-life to cause the at least one processing complex to perform battery end-of-life handling operations upon occurrence of one of the at least one battery backup unit backup unit reaching the second end-of-life.

18. The method of claim 16, further comprising:
determining whether each of the at least one battery backup unit is at the first end-of-life, wherein the sending of the message is performed in response to determining that the at least one battery backup unit is not at the first end-of-life.

19. The method of claim 16, wherein the at least one battery backup unit comprises at least two battery backup units, wherein the first extended power line disruption time is used in response to the at least two battery backup units having reached the second end-of-life when the second end-of-life and the second extended power line disruption time are currently being used in the system, wherein the operations further comprise:
sending to a hardware management controller information on the second extended power line disruption time being used in the system.

20. The method of claim 16, wherein there is at least one additional extended power line disruption time and corresponding at least one additional end-of-life, wherein the request indicates to change to any of the first, second and at least one additional extended power line disruption times different from a current extended power line disruption time being used by the power distribution unit to determine when to initiate the graceful shutdown after power disruption.

21. A method for managing an extended power line disruption time for a system having at least one battery backup unit, comprising:
receiving a request to change from a first extended power line disruption time currently used in the system to a second extended power line disruption time, wherein the first and second extended power line disruption times comprise a time during which the system continues with read and write operations using power from the at least one battery backup unit before initiating a graceful shutdown procedure of the system, and wherein a first end-of-life and a second end-of-life correspond to the first extended power line disruption time and the second extended power line disruption time, respectively, and wherein the first end-of-life is greater than the second end-of-life and the first extended power line disruption time is less than the second extended power line disruption time;
sending a message to a power distribution unit with information on the second extended power line disruption time to cause the power distribution unit to initiate a graceful shutdown of the system after power is supplied from the at least one battery backup unit for the second extended power line disruption time; and
in response to the at least one battery backup unit having reached the second end-of-life when the second end-of-life and the second extended power line disruption time are being used in the system, indicating, by the power distribution unit, to use the first extended power line disruption time to determine when to initiate the graceful shutdown of the system in response to the power to the system switching to the at least one battery backup unit.

\* \* \* \* \*